(12) United States Patent
Paulin

(10) Patent No.: US 12,418,994 B2
(45) Date of Patent: Sep. 16, 2025

(54) DEVICE FOR AND METHOD OF REDUCING ENERGY LOSS IN ELECTRICAL COMPONENTS

(71) Applicant: Peter Paulin, Decatur, IL (US)

(72) Inventor: Peter Paulin, Decatur, IL (US)

( * ) Notice: Subject to any disclaimer, the term of this patent is extended or adjusted under 35 U.S.C. 154(b) by 369 days.

(21) Appl. No.: 17/668,354

(22) Filed: Feb. 9, 2022

(65) Prior Publication Data

US 2022/0272851 A1 Aug. 25, 2022

Related U.S. Application Data

(60) Provisional application No. 63/147,563, filed on Feb. 9, 2021.

(51) Int. Cl.

| | |
|---|---|
| *H05K 5/02* | (2006.01) |
| *G01K 13/00* | (2021.01) |
| *G05D 23/19* | (2006.01) |
| *G06F 1/20* | (2006.01) |
| *H05K 7/20* | (2006.01) |

(52) U.S. Cl.
CPC ......... *H05K 5/0213* (2013.01); *G01K 13/006* (2013.01); *G05D 23/1931* (2013.01); *G06F 1/206* (2013.01); *H05K 7/20372* (2013.01); *G01K 2203/00* (2013.01)

(58) Field of Classification Search
CPC ............. H05K 5/0213; H05K 7/20372; G01K 13/006; G01K 2203/00; G01K 13/00; G05D 23/1931; G06F 1/206

See application file for complete search history.

(56) References Cited

U.S. PATENT DOCUMENTS

| | | | |
|---|---|---|---|
| 6,158,833 A | * | 12/2000 | Engler ................. H05K 5/0209 312/409 |
| 9,435,578 B2 | * | 9/2016 | Calderon .............. F25D 11/006 |
| 2008/0113869 A1 | * | 5/2008 | Selvamanickam ......................... H10N 60/0576 505/238 |
| 2009/0045203 A1 | * | 2/2009 | Ehrlich ..................... E05G 1/02 312/409 |
| 2009/0050365 A1 | * | 2/2009 | Moore ................... H05K 5/021 174/547 |
| 2020/0110047 A1 | * | 4/2020 | Hume .................. F25D 31/005 |

* cited by examiner

*Primary Examiner* — Adam B Dravininkas
(74) *Attorney, Agent, or Firm* — Law Office of Jerry Joseph, PLC; Jerry Joseph

(57) ABSTRACT

A system for improving an electrical conductivity and reducing an electrical energy loss in an electrical component, the system includes a temperature sensor, insulation for enclosing the electrical component and the temperature sensor, a cooling source to be coupled to the electrical component through the insulation, and a computer connected to the cooling source and the temperature sensor, where the computer is configured to control the cooling source to cool the electrical component to a user-definable temperature as indicated by the temperature sensor and maintain the electrical component at the user-definable temperature for a user-definable period of time.

7 Claims, 8 Drawing Sheets

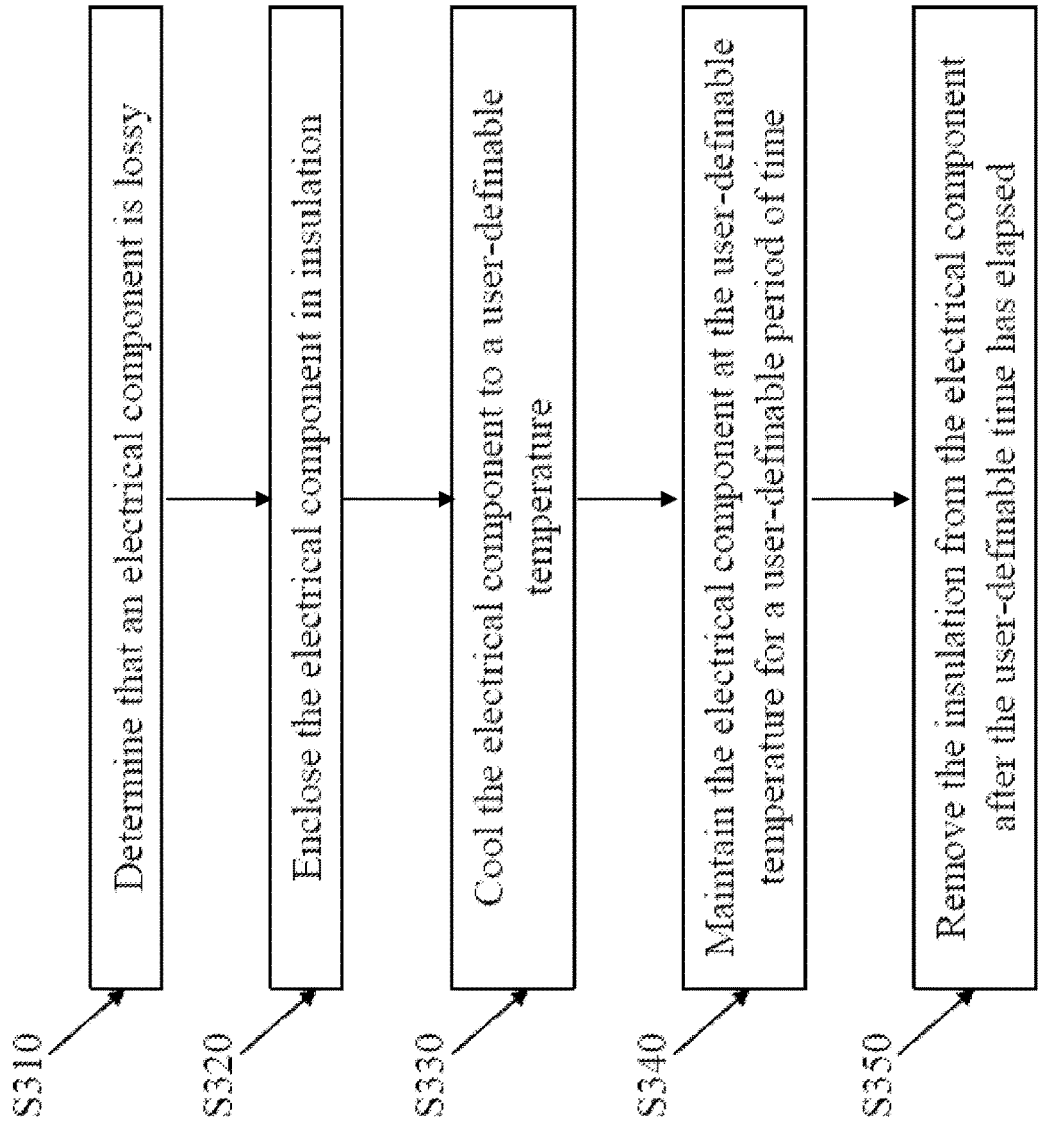

FIG. 4A

Table 1A
Untreated Motor

| Voltage (Volts) | Current (Amps) | Power In (Watts) | Speed (RPM) | Torque (N*m) | Power Out (Watts) | Efficiency (%) | Losses (Watts) |
|---|---|---|---|---|---|---|---|
| 25.7 | 1.418 | 36 | 3089 | 0 | 0 | 0 | 36 |
| 25.7 | 8.110 | 208 | 2891 | 0.424 | 128.32 | 61.54 | 80 |
| 25.7 | 15.160 | 390 | 2986 | 0.847 | 238.44 | 61.18 | 151 |
| 25.7 | 22.080 | 567 | 2469 | 1.271 | 328.77 | 57.91 | 239 |
| 25.7 | 29.070 | 747 | 2271 | 1.694 | 403.21 | 53.95 | 344 |

FIG. 4B

Table 1B
Untreated Motor

| Speed vs. Torque | |
|---|---|
| Slope | -3.43 |
| Intercept | 3093 |
| Correlation | -0.999 |

No Load RPM (NLRPM)
901.7

| Current vs. Torque | |
|---|---|
| Slope | 0.1155 |
| Intercept | 1.3128 |
| Correlation | 1.000 |

FIG. 5A

Table 2A
Treated Motor

| Voltage (Volts) | Current (Amps) | Power In (Watts) | Speed (RPM) | Torque (N*m) | Power Out (Watts) | Efficiency (%) | Losses (Watts) |
|---|---|---|---|---|---|---|---|
| 24.0 | 1.472 | 35 | 3324 | 0 | 0 | 0 | 35 |
| 24.0 | 9.246 | 222 | 3077 | 0.565 | 182.10 | 82.03 | 40 |
| 24.0 | 17.320 | 416 | 2851 | 1.130 | 337.45 | 81.15 | 78 |
| 24.0 | 25.190 | 605 | 2650 | 1.694 | 470.50 | 77.79 | 134 |
| 24.0 | 33.400 | 802 | 2399 | 2.260 | 567.91 | 70.82 | 234 |

FIG. 5B

Table 2B
Treated Motor

| Speed vs. Torque | |
|---|---|
| Slope | -2.85 |
| Intercept | 3316 |
| Correlation | -0.994 |

| Current vs. Torque | |
|---|---|
| Slope | 0.0998 |
| Intercept | 1.3656 |
| Correlation | 1.000 |

No Load RPM (NLRPM)
1164.9 ary filed on The foregoing and/or other aspects of the present general inventive concept may also be achieved by providing a system for improving an electrical conductivity and reducing an electrical energy loss in an electrical component, the system includes a temperature sensor; insulation for enclosing the electrical component and the temperature sensor; a cooling source to be coupled to the electrical component through the insulation; and a computer connected to the cooling source and the temperature sensor, where the computer is configured to control the cooling source to cool the electrical component to a user-definable temperature as indicated by the temperature sensor and maintain the electrical component at the user-definable temperature for a user-definable period of time.

DEVICE FOR AND METHOD OF REDUCING ENERGY LOSS IN ELECTRICAL COMPONENTS

PRIORITY

This application claims priority under 35 U.S.C. § 119(e) to a United States Provisional patent application filed on Feb. 9, 2021 in the United States Patent and Trademark Office and assigned Ser. No. 63/147,563, the entire contents of which are incorporated herein by reference.

BACKGROUND OF THE INVENTION

1. Field of the Invention

The present general inventive concept relates to a device for and a method of reducing energy loss in electrical components and devices, including transformers, electric motors, and the like.

2. Description of the Related Art

Faint humming is sometimes heard around a power line. This sound is due to poor electrical conduction in an electrical transformer, which results in the loss of electrical energy and heat. Electrical energy loss increases the cost of delivering electrical energy. It is estimated that out of the $2 billion dollars spent annually on electrical energy by the United States Department of Defense (DoD), approximately $300 million is lost due to inefficient energy transmission.

Thus, there is a need to maximize electrical conduction and minimize or reduce electrical energy loss in electrical components and devices, including transformers and electric motors.

SUMMARY OF THE INVENTION

The present general inventive concept provides a device or system for and a method of improving or reducing energy loss in electrical devices and components, including transformers and electric motors.

The foregoing and/or other aspects of the present general inventive concept may be achieved by providing a system for improving electrical conductivity and reducing electrical energy loss in an electrical component or device, including a temperature sensor; insulation for enclosing an electrical component of the electrical device and the temperature sensor; a cooling source to be coupled to the electrical component through the insulation; and a computer connected to the cooling source and the temperature sensor, where the computer is configured to control the cooling source to cool the electrical component to a user-definable temperature as indicated by the temperature sensor and maintain the electrical component at the user-definable temperature for a user-definable period of time.

The foregoing and/or other aspects of the present general inventive concept may also be achieved by providing a method of improving electrical conductivity and reducing electrical energy loss in an electrical component or device, including enclosing an electrical component of the electrical device in insulation; cooling the electrical component to a user-definable temperature; maintaining the electrical component at the user-definable temperature for a user-definable period of time; and removing the insulation from the electrical component after the user-definable period of time.

The electrical component may comprise a grain oriented electric steel (GOES).

The electrical component may be selected from a group of electrical components consisting of an electrical transformer and an electric motor.

The user-definable temperature may be about minus 37.77 Fahrenheit (F) to about minus 300 Celsius (C).

The cooling source may include liquid nitrogen. However, the present general inventive concept is not limited thereto.

The computer may be further configured to cool the electrical component using a cooling profile.

The user-definable time may be between about 1 hour to about 48 hours.

The system may further include a frequency generator connected to the computer and to be detachably coupled to the electrical component, where the frequency generator, under control of the computer, may be configured to generate frequencies including a natural resonant frequency and an attenuated resonant frequency of the electrical component.

The foregoing and/or other aspects of the present general inventive concept may also be achieved by providing a method of improving an electrical conductivity and reducing an electrical energy loss in an electrical component, the method includes enclosing the electrical component in insulation; cooling the electrical component to a user-definable temperature; maintaining the electrical component at the user-definable temperature for a user-definable period of time; and removing the insulation from the electrical component after the user-definable period of time.

The electrical component may include a grain oriented electric steel (GOES).

The electrical component may be selected from a group of electrical components consisting of an electrical transformer and an electrical motor.

The electrical component may be determined by a level of humming produced by the electrical component.

The electrical component may be selected by comparing a level of electrical energy supplied to the electrical component to a level of electrical energy transmitted by the electrical component.

The user-definable temperature is between about minus 37.77 Celsius (C) to about minus 300 Celsius (C). However, the present general inventive concept is not limited thereto.

The electrical component may be cooled using liquid nitrogen.

The electrical component may be cooled using a cooling profile.

The user-definable time may be about 1 hour to about 48 hours.

The method may further include applying frequencies to the electrical component, where the frequencies include a natural resonant frequency and an attenuated resonant frequency of the electrical component.

The method may further include applying frequencies to the electrical component, where the frequencies include a natural resonant frequency and an attenuated resonant frequency of the electrical component.

The foregoing and/or other aspects of the present general inventive concept may also be achieved by providing a method of improving an efficiency of electrical equipment having a core comprising a metal, the method includes subjecting the core of the electrical equipment to a cryogenic treatment designed to improve electrical characteristics of the metal.

The core may comprise a grain oriented electric steel (GOES).

The cryogenic treatment may comprise an exposure of the core to liquid nitrogen for a predetermined period of time.

The predetermined period of time may be between about 1 hour to about 48 hours.

Additional aspects of the present general inventive concept will be set forth in part in the description which follows and, in part, will be obvious from the description, or may be learned by practice of the general inventive concept.

BRIEF DESCRIPTION OF THE DRAWINGS

FIG. 3 illustrates a method of improving electrical conductivity and reducing electrical energy loss in an electrical component according to an embodiment of the present invention;

FIG. 4A presents a table of operational data for a motor untreated by a method of the present invention;

FIG. 4B presents a current vs. torque table and a speed vs. torque table of test analysis of operational data for a motor untreated by a method of the present invention;

FIG. 5A presents a table of operational data for a motor treated by a method of the present invention;

FIG. 5B presents a current vs. torque table and a speed vs. torque table of test analysis of operational data for a motor treated by a method of the present invention.

DESCRIPTION OF INVENTION

Figure 1:
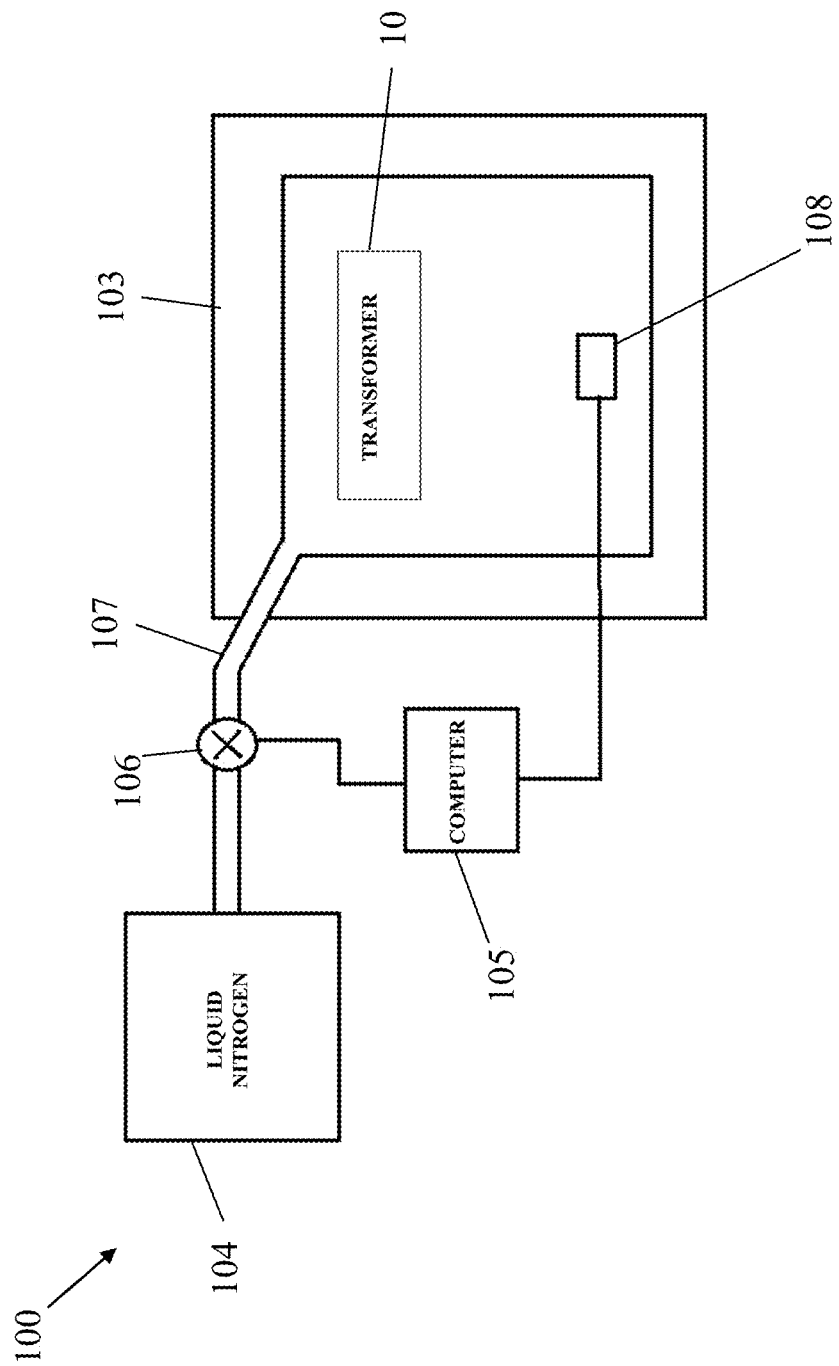
FIG. 1 is a schematic of a device according to an embodiment of the present invention.

The present general inventive concept provides a device for and a method of maximizing or improving electrical conduction and minimizing or improving electrical energy loss in electrical components, devices, or systems, including but not limited to electrical transformers and electric motors. The present invention also provides an increase in motor torque, an increase in revolutions per minute (RPMs), and a decrease in electrical current draw. However, the present general inventive concept is not limited thereto.

The method according to the present invention limits and/or reduces grain size of grain oriented electric steel (GOES), which in turn reduces eddy current and hysteresis loss. Typically, electrical transformers and electric motors are manufactured using GOES steel. As such, it is estimated that the methods according to the present invention provide an estimated 15% benefit and improvement in electrical energy transmission of electrical transformers and electric motors over commercial electrical transformers and electric motors, where the improvement lasts for the life of the improved electrical transformer and electric motor.

It is estimated that electrical transformers of the present invention would save up to $45 million dollars in electrical energy lost annually for the DoD, due to an improvement in energy transmission efficiency. If electrical transformers last 25 years, then over $1 billion dollars may be saved by the DoD.

The present invention in preferred embodiments uses cryogenic processing to improve the energy transmission efficiency of electrical components, including but not limited to electrical transformers and electric motors.

A commercial electrical transformer loses electrical energy through imperfections in its iron core. The iron core has millions of small gaps that hamper efficient electromagnetic flow.

The present invention in preferred embodiments uses a computer-controlled deep cryogenic process to cool metal portions of electrical components, devices, and systems such as electrical transformers to about minus 37.77 degrees Celsius to approximately minus 148.88 degrees Celsius. This extreme cold temperature rearranges iron molecules in the iron core of the electrical components (e.g., transformer) to make the iron molecules more uniform, which reduces electrical resistance and dramatically improves transformer efficiency.

By closing the microscopic gaps in an iron core of an electrical transformer utilizing the present invention, the conductivity of the iron core is improved. The cryogenic process of the present inventive concept can be done one time and the improvement in conductivity may reduce the amount of electrical energy lost by an electrical transformer by about 15% over its entire lifespan.

A method of maximizing or improving the electrical energy transmission and minimizing or reducing the electrical energy loss of electrical components according to the present invention is illustrated in FIG. 3. Steps of the method are shown as S310 (Determine that the electrical component is lossy), S320 (Enclose the electrical component (i.e., core member) in insulation), S330 (Cool the electrical component (i.e., core member) to a user-definable temperature), S340 (Maintain the electrical component (i.e., core member) at the user-definable temperature for a user-definable period of time), and S350 (Remove the insulation from the electrical component (i.e., core member) after the user-definable period of time). The method of the present invention includes one or more of the steps, in any permutation thereof A first step of a method of maximizing the electrical energy transmission and minimizing the electrical energy loss of electrical components is to identify a lossy electrical component, such as a lossy electrical transformer or a lossy electrical motor. As an example of this step, see S310 of FIG. 3. An electrical transformer may be identified as lossy by the level of humming produced by the electrical transformer, by comparing the amount of electrical energy provided to the electrical transformer to the amount of electrical energy transmitted by the electrical transformer, and any other suitable method. The present invention may be used on an electrical transformer before or after being installed operationally, without needing to disassemble the electrical transformer.

A second step of the method is to enclose the identified electrical component in insulation. As an example of this step, see S320 of FIG. 3. It should be understood that the component need not be completely enclosed in insulation, but rather must be enclosed enough to enable the device to cool the component to the desired temperature.

A third step of the method is to cool (e.g., use a computer to accurately cool) the insulated electrical component to a user-definable temperature (e.g., about minus 148.88 degrees Celsius). As an example of this step, see S330 of FIG. 3. The electrical component may be cooled using liquid nitrogen. Liquid nitrogen is non-toxic and chemical-free. The computer-controlled cooling of the insulated electrical transformer may be done with a particular cooling profile. For example, the cooling profile can be tailored to one or more types of electrical components, and include directions and/or instructions for optimal cooling times, cooling rates, and/or other cooling parameters for such types. It should be understood that other substances for, methods of, and mechanisms for cooling are also contemplated by the present invention.

A fourth step of the method is to maintain the insulated electrical component at the user-definable temperature for a user-definable period of time. As an example of this step, see S340 of FIG. 3. For example, in an embodiment of the present invention, the electrical component may be kept at about minus 37.77 degrees Celsius to about minus 148.88 degrees Celsius for about 48 hours. However, the present invention is not limited to keeping the electrical component at about minus 148.88 degrees Celsius for about 48 hours but may use other temperatures and times, such as between minus 37.77 degrees Celsius for about 24 hours. In the present embodiment, the electrical component is kept at minus 148.88 degrees Celsius for 24 hours. It should be understood that the present invention contemplates and encompasses maintaining the electrical component temperature at or near the user-definable temperature for at or near the user-definable period of time, and that precise maintenance of the electrical component constantly at an exact temperature for an exact period of time is not necessary for the effectiveness of the present invention.

A fifth step of the method is to remove the insulation from the electrical component after the user-definable period of time has elapsed. As an example of this step, see S350 of FIG. 3. Since liquid nitrogen is at a low-pressure, it does not create any offsetting fumes. Thus, liquid nitrogen safely evaporates into the atmosphere. Because Earth's atmosphere is nearly 80% nitrogen, the release of nitrogen into the air is not detrimental to the environment.

FIG. 1 is a schematic of a device 100 according to the present invention for maximizing the electrical energy transmission and minimizing the electrical energy loss of electrical components, such as a transformer 10.

Referring to FIG. 1, the lossy electrical transformer 10 is identified. Such an electrical transformer 10 may be identified by the level of humming produced by the electrical transformer 10, by comparing the amount of electrical energy provided to the electrical transformer to the amount of electrical energy transmitted by the electrical transformer, and any other suitable method. The present invention may be used on an electrical transformer 10 before or after being installed operationally, without having to disassemble the electrical transformer.

The electrical transformer 10 is enclosed in insulation 103. It should be understood that the transformer 10 need not be completely enclosed in insulation, but rather must be enclosed enough to enable the device to cool the transformer 10 to the desired temperature.

Liquid nitrogen 104 (e.g., in tank form) is used to cool the electrical transformer 10 to at about minus 37.77 degrees Celsius to about minus 148.88 degrees Celsius. In the present embodiment, the electrical transformer 10 is cooled to minus 148.88 degrees Celsius. It should be understood that other substances for cooling are also contemplated by the present invention and that the present invention is not limited to the use of liquid nitrogen. Further, the present invention is not limited to the user-definable temperature being minus 148.88 degrees Celsius, but rather contemplates any other effective cooling temperature. That is, in alternative embodiments, the user-definable temperature may be between about minus 37.77 degrees Celsius to about minus 148.88 degrees Celsius.

A computer (or CPU) 105 is used to control a valve 106 connected to the liquid nitrogen 104, where the valve 106 is connected to a tube 107 that is fed through the insulation 103 in order to accurately cool the insulated electrical transformer 10 to minus 148.88 degrees Celsius. Liquid nitrogen is non-toxic and chemical-free. The computer-controlled cooling of the insulated electrical transformer 10 may be done with a particular cooling profile. For example, the cooling profile can be tailored to one or more types of electrical components, and include directions and/or instructions for optimal cooling times, cooling rates, and/or other cooling parameters for such types. It should be understood that other methods of, and mechanisms for cooling are also contemplated by the present invention.

A computer (or CPU) 105 is used to control a valve 106 connected to the liquid nitrogen 104, where the valve 106 is connected to a tube 107 that is fed through the insulation 103 in order to accurately cool the insulated electrical transformer 10 to minus 300 degrees Fahrenheit. Liquid nitrogen is non-toxic and chemical-free. The computer-controlled cooling of the insulated electrical transformer 10 may be done with a particular cooling profile. For example, the cooling profile can be tailored to one or more types of electrical components, and include directions and/or instructions for optimal cooling times, cooling rates, and/or other cooling parameters for such types. It should be understood that other methods of, and mechanisms for cooling are also contemplated by the present invention.

A temperature sensor 108 is included within the insulation 103 and is connected to the computer 105 to monitor a temperature within a chamber formed by the insulation 103.

The computer 105 maintains the insulated electrical transformer 10 at minus 148.88 degrees Celsius for a user-definable period of time. For example, the electrical transformer 10 may be kept at about minus 37.77 degrees Celsius to about minus 148.88 degrees Celsius for about 48 hours. However, the present invention is not limited to keeping the electrical transformer 10 at about minus 148.88 degrees Celsius for about 48 hours but may use other temperatures and times. It should be understood that the present invention contemplates and encompasses maintaining the electrical component temperature at or near the user-definable temperature for at or near the user-definable period of time, and that precise maintenance of the electrical component constantly at an exact temperature for an exact period of time is not necessary for the effectiveness of the present invention.

After the electrical transformer 10 has been kept at the user-definable temperature for the user-definable time, the computer 105 closes the valve 106 and the insulation 103 is removed from the electrical transformer 101. Since liquid nitrogen is at a low-pressure, it does not create any offsetting fumes. Thus, any nitrogen within the insulation 103 safely evaporates into the atmosphere. Because Earth's atmosphere is nearly 80% nitrogen, the release of nitrogen into the air is not detrimental to the environment.

The benefits of the present invention include not requiring any replacement of a lossy electrical transformer, no further maintenance on an electrical transformer treated with the present invention, and no carbon emission into the atmosphere. The present invention requires only one application of the method described herein to a lossy electrical transformer to improve the electrical transmission of the electrical transformer, which could reduce the energy loss of the electrical transformer by 15% as compared to the electrical transformer prior to being treated with the present invention over the operational life of the electrical transformer, which could be as long as 25 years.

Energy loss can originate from three main sources, including hysteresis loss, eddy current loss, and anomalous loss. Hysteresis loss is related to the area contained within the hysteresis loop and eddy current loss is related to the generation of electric currents in the magnetic material and the associated resistive losses. Anomalous loss is related to the movement of domain walls within the material.

The amount of electricity that goes into, and comes out of, an electrical transformer can be measured. If one untreated transformer loses $20,000 a year worth of electricity, an electrical transformer cryogenically treated with the present invention may save approximately $3,000 per year.

Transformers last about 25 years. Thus, $75,000 may be saved over a lifetime of an electrical transformer treated by the present invention. By applying the present invention to the thousands of electrical transformers that are in operation, hundreds of millions of dollars may be saved, and the present invention is eco-friendly, low-maintenance, and only requires one treatment of the present invention per electrical transformer.

Figure 2:
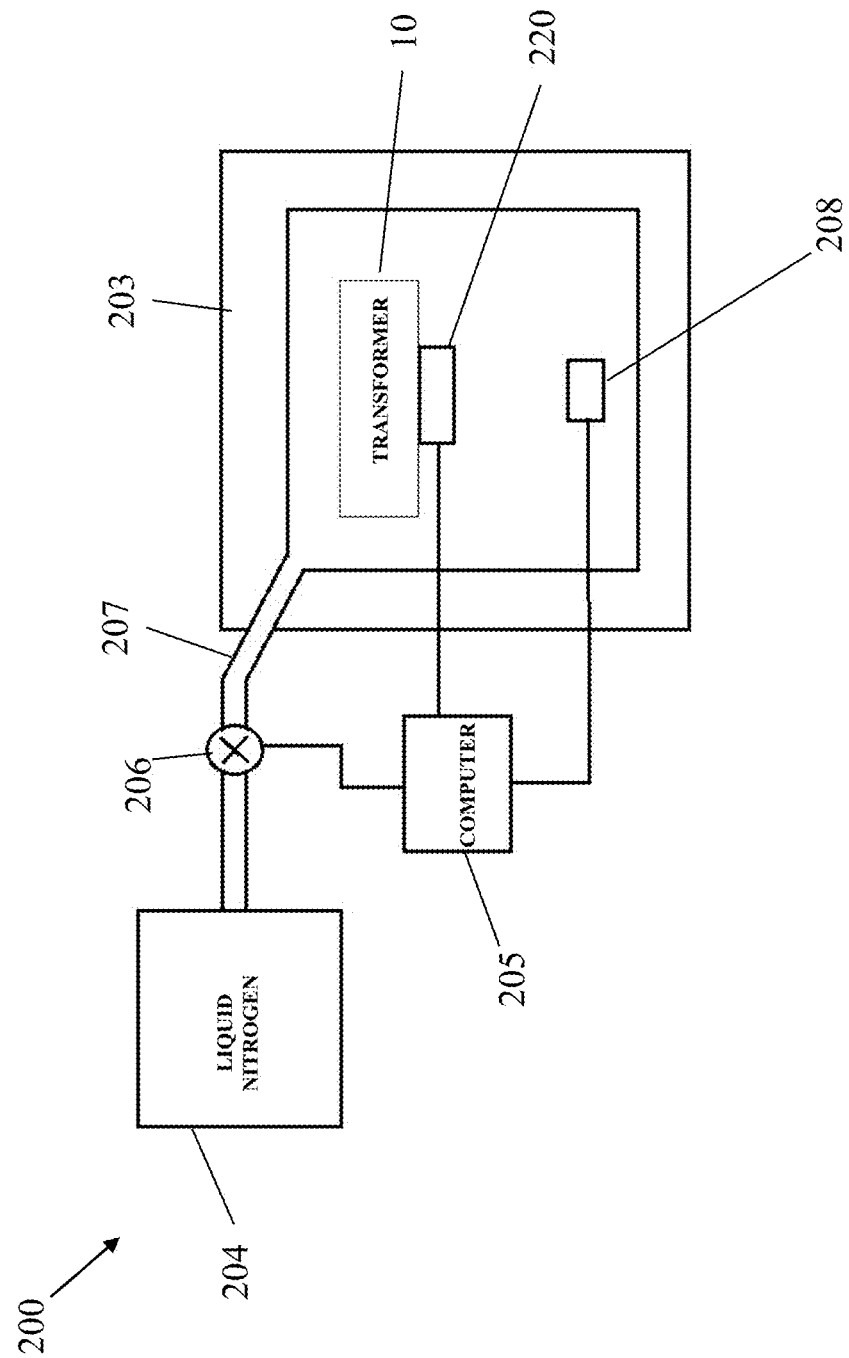
FIG. 2 is a schematic of a device according to another embodiment of the present invention.

FIG. 2 is a schematic of a device 200 according to another embodiment of the present invention for maximizing or increasing the electrical energy transmission and minimizing or reducing the electrical energy loss of electrical components, such as a transformer 10. However, the device of the present invention may be used to cool, and the method according to the present invention may be performed on, various other electrical components, including bit not limited to electric motors.

Referring to FIG. 2, the device 200 is similar to the previous embodiment shown in FIG. 1 and further includes a frequency generator 220 that is coupled to (preferably detachably coupled to) the transformer 10 to assist in rearranging and/or realigning iron molecules. For example, the frequency generator 220 can be configured to generate frequencies that cause iron molecules subjected to the frequencies to move to a more energy efficient arrangement and/or alignment. These can include, without limitation, an attenuated resonant frequency and a natural resonant frequency.

Figure 6:
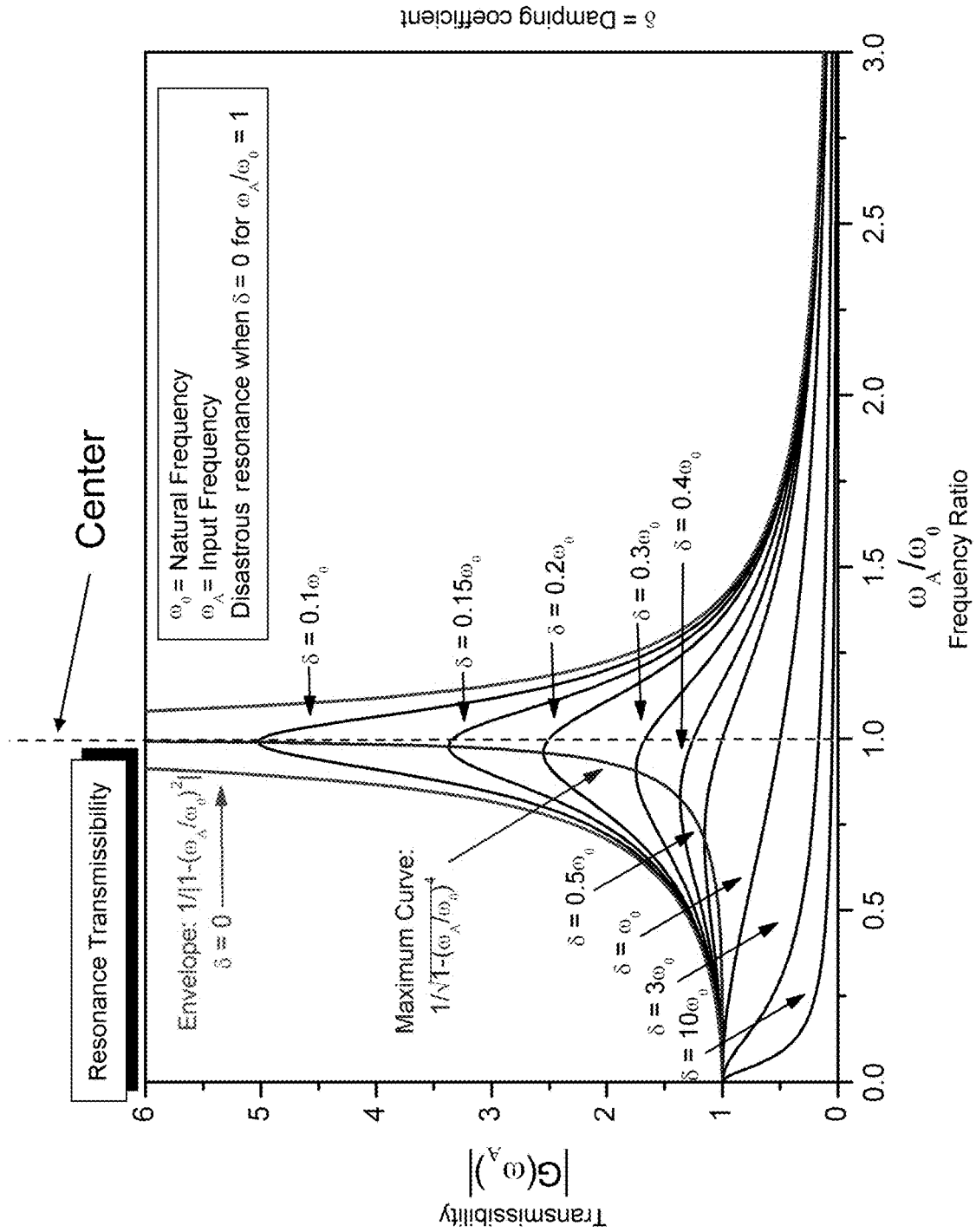
FIG. 6 presents a graph illustrating an increase of amplitude as damping decreases and frequency approaches resonant frequency of a driven harmonic oscillator.

Natural Resonant frequency is the oscillation of a system at its natural or unforced resonance. Most systems have one resonant frequency and multiple harmonic frequencies that get progressively lower in amplitude as they move away from the center. (See FIG. 6).

The present invention in preferred embodiments uses a computer-controlled deep cryogenic process to cool metal portions of electrical components to a user-definable temperature (e.g., minus 148.88 degrees Celsius), while generating and directing one or more alignment frequencies onto transformer 10.

The electrical transformer 10 is enclosed in insulation 203. It should be understood that the electrical component need not be completely enclosed in insulation, but rather must be enclosed enough to enable the device to cool the component to the desired temperature.

Liquid nitrogen 204 (e.g., in tank form) is used to cool the electrical transformer 10 to at least minus 148.88 degrees Celsius. It should be understood that other substances for cooling are also contemplated by the present invention and that the present invention is not limited to the use of liquid nitrogen. Further, the present invention is not limited to the user-definable temperature being minus 148.88 degrees Celsius, but rather contemplates any other effective cooling temperature.

A computer (or CPU) 205 is used to control a valve 206 connected to the liquid nitrogen 204, where the valve 206 is connected to a tube 207 that is fed through the insulation 203 in order to accurately cool the insulated electrical transformer 10 to minus 148.88 degrees Celsius. Liquid nitrogen is non-toxic and chemical-free. The computer-controlled cooling of the insulated electrical transformer 10 may be done with a particular cooling profile. For example, the cooling profile can be tailored to one or more types of electrical components, and include directions and/or instructions for optimal cooling times, cooling rates, and/or other cooling parameters for such types. It should be understood that other methods of, and mechanisms for cooling are also contemplated by the present invention.

A temperature sensor 208 is included within the insulation 203 and is connected to the computer 205 to monitor a temperature within a chamber formed by or area defined by the insulation 203.

The computer 205 maintains the insulated electrical transformer 10 at minus 148.88 degrees Celsius for a user-definable period of time. For example, the electrical transformer 10 may be kept at minus 148.88 degrees Celsius for at least 48 hours. However, the present invention is not limited to keeping the electrical transformer 10 at minus 148.88 degrees Celsius for at least 48 hours but may use other temperatures and times. It should be understood that the present invention contemplates and encompasses maintaining the electrical component temperature at or near the user-definable temperature for at or near the user-definable period of time, and that precise maintenance of the electrical component constantly at an exact temperature for an exact period of time is not necessary for the effectiveness of the present invention.

The frequency generator 220 may be coupled to (preferably detachably coupled to) the transformer 10 to generate and direct a wave of frequencies. For example, the frequency generator 220 can be configured to generate frequencies that cause iron molecules subjected to the frequencies to move to a more energy efficient arrangement and/or alignment. These can include, without limitation, an attenuated resonant frequency and a natural resonant frequency.

FIG. 4A illustrates a table of operational data for a motor untreated by a method of the present invention and FIG. 4B illustrates a table of test analysis of operational data for a motor untreated by a method of the present invention;

FIG. 5A illustrates a table of operational data for a motor treated by a method of the present invention and FIG. 5B illustrates a table of test analysis of operational data for a motor treated by a method of the present invention.

Referring now to FIGS. 4A, 4B, 5A, and 5B, experimental data showing an example of the effectiveness and unexpected results of the present invention is presented.

To generate the experimental data presented in FIGS. 4A,B and 5A,B, a half horsepower electric direct current (DC) motor was run on a dynamometer to establish baselines for power draw, revolutions per minute (RPMs), amperage, wattage, horsepower (HP) and efficiency. These baselines are shown in Table 1A of FIG. 4A. A constant voltage of 25.7 V was maintained.

The motor was then treated by an embodiment of the method of the present invention as described herein. More specifically, the motor was enclosed in insulation, cooled using liquid nitrogen under computer control to minus 148.88 degrees Celsius and maintained at that temperature for 24 hours. Then, the insulation was removed.

After the insulation was removed, the same motor was rerun on the same dynamometer. A constant voltage of 24.0 V was maintained. The results for power draw, revolutions per minutes (RPMs), amperage, wattage, horsepower (HP) and efficiency are shown in Table 2A of FIG. 5A.

The unexpected improvements are clear: After treatment in accordance with a method of the present invention, the motor experienced reduced power draw, higher RPMs, less wattage and less amperage, higher horsepower, and higher efficiency.

As illustrated in FIGS. 4B and 5B, the test using the untreated motor resulted in a no-load RPM (NLRPM) of 901.7. However, surprisingly and unexpectedly, when using the motor treated by the method of improving electrical conductivity and reducing electrical energy loss in an electrical component according to the present inventive concept, resulted in a no-load RPM of 1164.9. As such, the method according to present invention yielded an unexpected and significant improvement of a 30% increase in no-load RPM (i.e, 1164.9=130% of 901.7). These changes represent efficiency benefits that would enable a car utilizing such a treated motor to travel 30% farther as compared with the same car utilizing the untreated motor.

Although a few exemplary embodiments of the present general inventive concept have been illustrated and described, it will be appreciated by those skilled in the art that changes may be made in these exemplary embodiments without departing from the principles and spirit of the general inventive concept, the scope of which is defined in the appended claims and their equivalents.

What is claimed is:

1. A system for improving an electrical conductivity and reducing an electrical energy loss in an electrical component, the system comprising:
    a temperature sensor;
    insulation for enclosing the electrical component and the temperature sensor;
    a cooling source to be coupled to the electrical component through the insulation;
    a computer connected to the cooling source and the temperature sensor, and
    a frequency generator connected to the computer and to be detachably coupled to the electrical component,
    wherein the frequency ger der control of the computer, is configured to generate frequencies including a natural resonant frequency and an attenuated resonant frequency of the electrical component, and
    where the computer is configured to control the cooling source to cool the electrical component to a user-definable temperature as indicated by the temperature sensor and maintain the electrical component at the user-definable temperature for a user-definable period of time.

2. The system of claim 1, wherein the electrical component comprises a grain oriented electric steel (GOES).

3. The system of claim 1, wherein the electrical component is selected from a group of electrical components consisting of an electrical transformer and an electric motor.

4. The system of claim 1, wherein the user-definable temperature is about minus 73.33 Celsius (C) (minus 100 degrees Fahrenheit (F) to about minus 184.44 Celsius (C) (minus 300 degrees Fahrenheit (F)).

5. The system of claim 1, wherein the cooling source comprises liquid nitrogen.

6. The system of claim 1, wherein the computer is further configured to cool the electrical component using a cooling profile.

7. The system of claim 1, wherein the user-definable time is between about 1 hour to about 48 hours.

* * * * *